(12) United States Patent
Sakisaka et al.

(10) Patent No.: US 7,999,634 B2
(45) Date of Patent: Aug. 16, 2011

(54) LAYERED LOW-PASS FILTER HAVING A CONDUCTING PORTION THAT CONNECTS A GROUNDING CONDUCTOR LAYER TO A GROUNDING TERMINAL

(75) Inventors: Yasunori Sakisaka, Tokyo (JP); Yukitoshi Kagaya, Tokyo (JP)

(73) Assignee: TDK Corporation, Tokyo (JP)

( * ) Notice: Subject to any disclaimer, the term of this patent is extended or adjusted under 35 U.S.C. 154(b) by 240 days.

(21) Appl. No.: 12/318,787

(22) Filed: Jan. 8, 2009

(65) Prior Publication Data

US 2009/0189715 A1 Jul. 30, 2009

(30) Foreign Application Priority Data

Jan. 29, 2008 (JP) ................. 2008-017074

(51) Int. Cl.
*H03H 7/01* (2006.01)
*H01P 3/08* (2006.01)
(52) U.S. Cl. ......... 333/185; 333/167; 333/177; 333/204
(58) Field of Classification Search .................. 333/177, 333/184, 185, 167, 204, 205
See application file for complete search history.

(56) References Cited

U.S. PATENT DOCUMENTS

| | | | | |
|---|---|---|---|---|
| 3,636,481 A | * | 1/1972 | Boulin et al. | 333/185 |
| 4,881,050 A | * | 11/1989 | Swanson, Jr. | 333/185 |
| 4,888,568 A | * | 12/1989 | Kawaguchi | 333/174 |
| 5,357,227 A | | 10/1994 | Tonegawa et al. | |
| 5,977,845 A | * | 11/1999 | Kitahara | 333/185 |
| 6,191,666 B1 | * | 2/2001 | Sheen | 333/185 |

FOREIGN PATENT DOCUMENTS

| | | |
|---|---|---|
| JP | A-05-259703 | 10/1993 |
| JP | A-05-299962 | 11/1993 |
| JP | A-06-097701 | 4/1994 |
| JP | A-2000-101378 | 4/2000 |
| JP | A-2003-0887074 | 3/2003 |
| JP | A-2007-258534 | 10/2007 |
| JP | A-2008-017242 | 1/2008 |

* cited by examiner

*Primary Examiner* — Robert Pascal
*Assistant Examiner* — Kimberly E Glenn
(74) *Attorney, Agent, or Firm* — Oliff & Berridge, PLC

(57) ABSTRACT

A layered low-pass filter includes: a layered substrate; an input terminal, an output terminal and a grounding terminal each disposed on a periphery of the layered substrate; first and second inductors connected in series and provided between the input terminal and the output terminal; first to fifth capacitors formed within the layered substrate; a grounding conductor layer provided within the layered substrate; and a conducting portion formed within the layered substrate. The conducting portion includes a conductor layer connected to the grounding terminal, and a conducting path formed of a plurality of through holes. The conducting portion connects the grounding conductor layer to the grounding terminal via a path longer than the shortest distance between the grounding conductor layer and the grounding terminal.

3 Claims, 14 Drawing Sheets

LAYERED LOW-PASS FILTER HAVING A CONDUCTING PORTION THAT CONNECTS A GROUNDING CONDUCTOR LAYER TO A GROUNDING TERMINAL

BACKGROUND OF THE INVENTION

1. Field of the Invention

The present invention relates to a layered low-pass filter formed using a layered substrate.

2. Description of the Related Art

Recently, there have been strong demands for reductions in size and thickness of electronic apparatuses for portable use typified by cellular phones and notebook personal computers, and accordingly, reductions in size and thickness have also been required for electronic components for use in such electronic apparatuses. Low-pass filters are one of the electronic components for use in such electronic apparatuses. Reductions in size and thickness are also required for low-pass filters. To meet this, it has been proposed to form a low-pass filter using a layered substrate, as disclosed in, for example, JP-A-5-259703, JP-A-5-299962, JP-A-6-097701 and JP-A-2000-101378. A low-pass filter formed using a layered substrate as mentioned above will be hereinafter called a layered low-pass filter.

To obtain a steep attenuation characteristic with a low-pass filter, the low-pass filter should preferably be of the fifth order or higher. A fifth-order low-pass filter includes, for example, a first inductor and a second inductor connected in series to each other, a first capacitor provided between the ground and the node between the two inductors, a second capacitor provided between the ground and an end of the first inductor opposite to the node, and a third capacitor provided between the ground and an end of the second inductor opposite to the node.

Inverse Chebyshev low-pass filters and elliptic (simultaneous Chebyshev) low-pass filters are known as being capable of providing a steeper attenuation characteristic. The inverse Chebyshev low-pass filters and the elliptic low-pass filters present at least one attenuation pole in the stop band.

For a signal path in which a low-pass filter is used, there are cases where it is required to increase attenuation especially in a specific narrow frequency band present in the stop band of the low-pass filter. An example of such cases is a case where, in a communication apparatus operable on a first communication system that uses a first frequency band and a second communication system that uses a second frequency band higher than the first frequency band, a low-pass filter for allowing signals in the first frequency band to pass and intercepting signals in the second frequency band is used in the path of the reception signal of the first communication system. In such a case, in the reception signal path in which the low-pass filter is used, it may be required to increase attenuation especially in the second frequency band present in the stop band of the low-pass filter.

In the case where it is required to increase attenuation especially in a specific narrow frequency band present in the stop band of a low-pass filter in the signal path in which the low-pass filter is used as described above, a notch filter for increasing attenuation in the specific narrow frequency band may be provided in series to the low-pass filter. Disadvantageously, however, this leads to an increase in insertion loss in the pass band of the low-pass filter.

JP-A-5-259703 discloses a technique of adjusting the frequency of the attenuation pole closest to the pass band by adjusting the inductance generated in an external electrode portion through changing the length of the external electrode. However, in the case where it is required to increase attenuation especially in a specific narrow frequency band present in the stop band of a low-pass filter in the signal path in which the low-pass filter is used, the specific narrow frequency band is typically present within a range from the frequency at which the attenuation pole closest to the pass band appears to a frequency on the order of several times higher than the cut-off frequency. In such a case, it is difficult to increase attenuation especially in the specific narrow frequency band present in the stop band by utilizing the attenuation pole closest to the pass band.

OBJECT AND SUMMARY OF THE INVENTION

It is an object of the present invention to provide a layered low-pass filter that allows an increase in attenuation especially in a specific narrow frequency band present in the stop band of the low-pass filter.

A layered low-pass filter of the present invention includes: a layered substrate including a plurality of dielectric layers stacked; an input terminal, an output terminal and a grounding terminal each disposed on a periphery of the layered substrate; a first inductor and a second inductor each formed using at least one conductor layer provided within the layered substrate, the first and second inductors being connected in series to each other and, in terms of circuit configuration, located between the input terminal and the output terminal; first to fifth capacitors provided within the layered substrate; a grounding conductor layer provided within the layered substrate; and a conducting portion provided within the layered substrate and connecting the grounding conductor layer to the grounding terminal.

In the layered low-pass filter of the present invention, in terms of circuit configuration, the first inductor is located closer to the input terminal than is the second inductor. Each of the first and second inductors has an input for receiving signals and an output for outputting signals. The output of the first inductor is connected to the input of the second inductor. The first capacitor is connected in parallel to the first inductor, and the second capacitor is connected in parallel to the second inductor. The third capacitor connects the grounding conductor layer to the output of the first inductor and to the input of the second inductor. The fourth capacitor connects the grounding conductor layer to the input of the first inductor. The fifth capacitor connects the grounding conductor layer to the output of the second inductor. The conducting portion connects the grounding conductor layer to the grounding terminal via a path longer than the shortest distance between the grounding conductor layer and the grounding terminal.

According to the layered low-pass filter of the present invention, first and second attenuation poles appear in the stop band. The second attenuation pole appears at a frequency higher than that at which the first attenuation pole appears. The frequency at which the second attenuation pole appears depends on the inductance component of the conducting portion. According to the present invention, the conducting portion connects the grounding conductor layer to the grounding terminal via a path longer than the shortest distance between the grounding conductor layer and the grounding terminal. Consequently, the inductance component of the conducting portion is greater than the inductance component of a path that connects the grounding conductor layer to the grounding terminal in the shortest distance. As a result, according to the present invention, the frequency at which the second attenuation pole appears is lower than in the case where the grounding conductor layer is connected to the grounding terminal via the shortest path.

In the layered low-pass filter of the present invention, the layered substrate may have a top surface, a bottom surface and a side surface, as the periphery. The grounding conductor layer may be disposed closer to the bottom surface than to the top surface, and the grounding terminal may be disposed on the side surface. In this case, the conducting portion may include a connecting conductor layer provided within the layered substrate and connected to the grounding terminal, and a conducting path that connects the connecting conductor layer and the grounding conductor layer to each other. The connecting conductor layer may be disposed between the grounding conductor layer and the top surface of the layered substrate. The conducting path may be formed using at least one through hole provided within the layered substrate, and may extend in a direction in which the layers of the layered substrate are stacked.

In the layered low-pass filter of the present invention, the conducting path may pass through the space between the first and second inductors within the layered substrate.

According to the layered low-pass filter of the present invention, the conducting portion connects the grounding conductor layer to the grounding terminal via a path longer than the shortest distance between the grounding conductor layer and the grounding terminal. Consequently, the second attenuation pole appears at a lower frequency than in the case where the grounding conductor layer is connected to the grounding terminal by the shortest path. As a result, according to the present invention, it is possible to increase attenuation especially in a specific narrow frequency band present in the stop band of the low-pass filter.

Other and further objects, features and advantages of the invention will appear more fully from the following description.

DESCRIPTION OF THE PREFERRED EMBODIMENT

Figure 3:
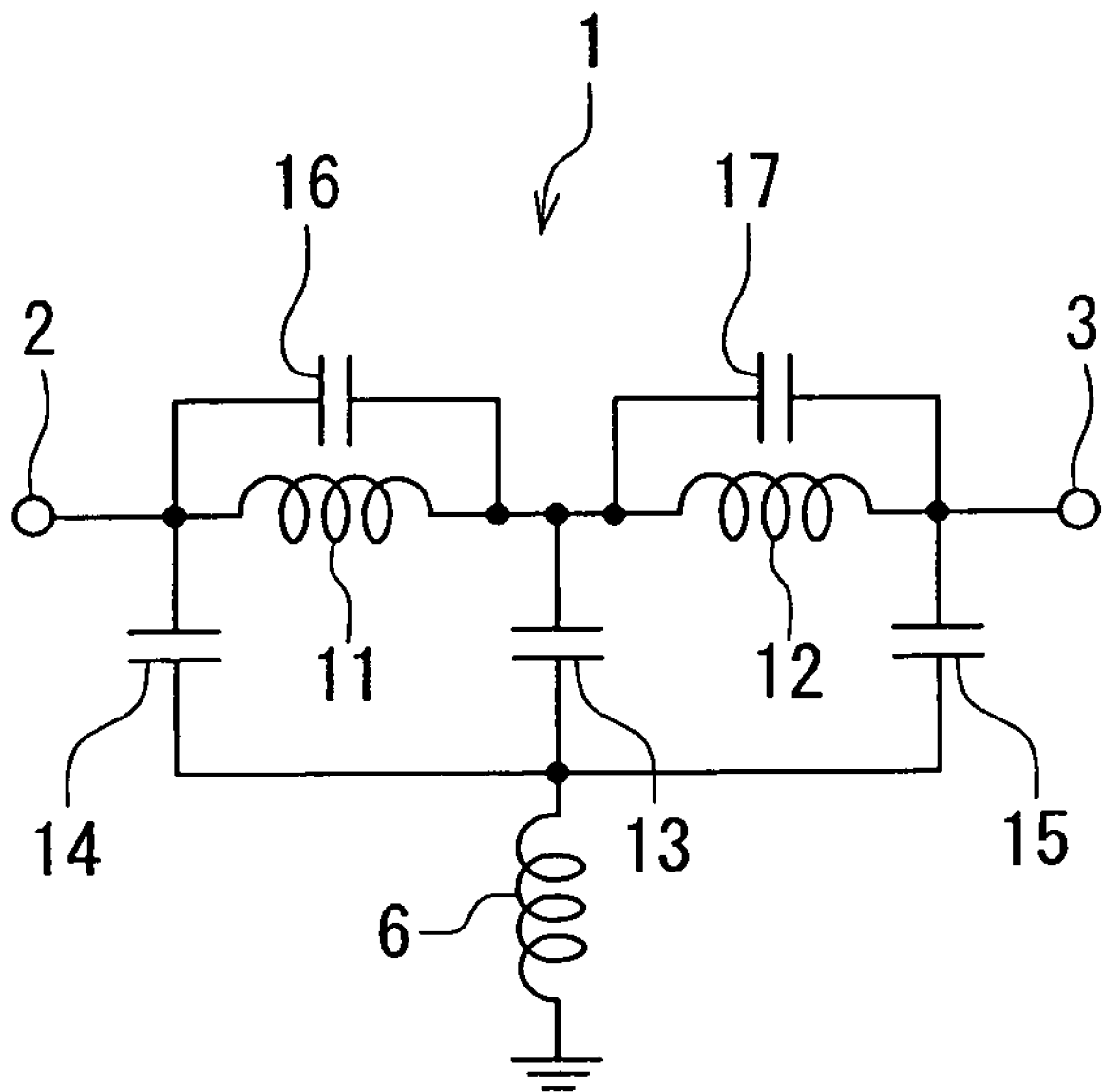
FIG. 3 is a circuit diagram illustrating the circuit configuration of the layered low-pass filter according to the embodiment of the invention.

A preferred embodiment of the present invention will now be described in detail with reference to the drawings. Reference is first made to FIG. 3 to describe the circuit configuration of a layered low-pass filter according to the preferred embodiment of the invention. As illustrated in FIG. 3, the layered low-pass filter 1 according to the embodiment includes: an input terminal 2 for receiving signals; an output terminal 3 for outputting signals; two inductors 11 and 12; five capacitors 13 to 17; and a conducting portion 6.

The inductors 11 and 12 are connected in series to each other and, in terms of circuit configuration, located between the input terminal 2 and the output terminal 3. In terms of circuit configuration, the inductor 11 is located closer to the input terminal 2 than is the inductor 12. The inductor 11 corresponds to the first inductor of the present invention, and the inductor 12 corresponds to the second inductor of the present invention. Each of the inductors 11 and 12 has an input for receiving signals and an output for outputting signals. The input of the inductor 11 is connected to the input terminal 2. The output of the inductor 11 is connected to the input of the inductor 12. The output of the inductor 12 is connected to the output terminal 3. It should be noted that the phrase "in terms of circuit configuration" used herein is intended to mean positioning in a schematic circuit diagram, not in the physical configuration.

The capacitor 16 is connected in parallel to the inductor 11. The capacitor 17 is connected in parallel to the inductor 12. The capacitor 16 corresponds to the first capacitor of the present invention, and the capacitor 17 corresponds to the second capacitor of the present invention.

In terms of circuit configuration, the capacitor 13 is located between the ground and the node between the inductors 11 and 12. The capacitor 13 has a first end and a second end opposite to each other. The first end of the capacitor 13 is connected to the node between the inductors 11 and 12, and the second end of the capacitor 13 is connected to the ground via the conducting portion 6. The capacitor 13 corresponds to the third capacitor of the present invention.

In terms of circuit configuration, the capacitor 14 is located between the ground and the input of the inductor 11. The capacitor 14 has a first end and a second end opposite to each other. The first end of the capacitor 14 is connected to the input of the inductor 11, and the second end of the capacitor 14 is connected to the ground via the conducting portion 6. The capacitor 14 corresponds to the fourth capacitor of the present invention.

In terms of circuit configuration, the capacitor 15 is located between the ground and the output of the inductor 12. The capacitor 15 has a first end and a second end opposite to each other. The first end of the capacitor 15 is connected to the output of the inductor 12, and the second end of the capacitor 15 is connected to the ground via the conducting portion 6. The capacitor 15 corresponds to the fifth capacitor of the present invention.

The conducting portion 6 has a first end and a second end opposite to each other. The first end of the conducting portion 6 is connected to the second end of each of the capacitors 13, 14 and 15, and the second end of the conducting portion 6 is connected to the ground. The conducting portion 6 has an inductance component. Therefore, FIG. 3 depicts the conducting portion 6 with a symbol representing an inductor.

The layered low-pass filter 1 has a circuit configuration of a fifth-order inverse Chebyshev or fifth-order elliptic low-pass filter. In the layered low-pass filter 1, when signals are received at the input terminal 2, those at frequencies equal to or lower than a specific cut-off frequency selectively pass through the layered low-pass filter 1 and are outputted from the output terminal 3. This layered low-pass filter 1 exhibits two attenuation poles in the stop band.

Figure 1:
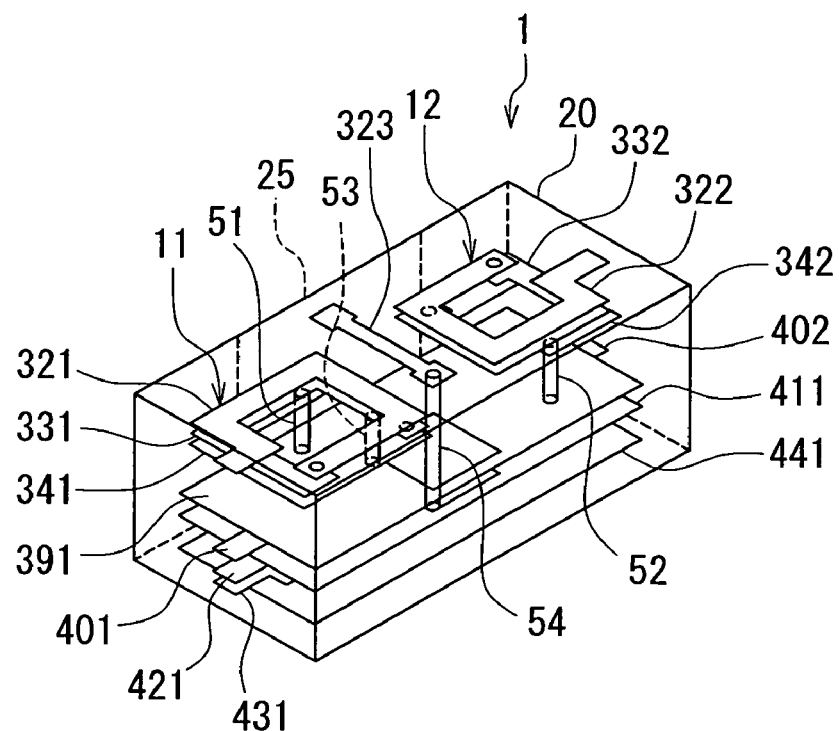
FIG. 1 is a perspective view illustrating the main part of a layered low-pass filter according to an embodiment of the invention.
Figure 2:
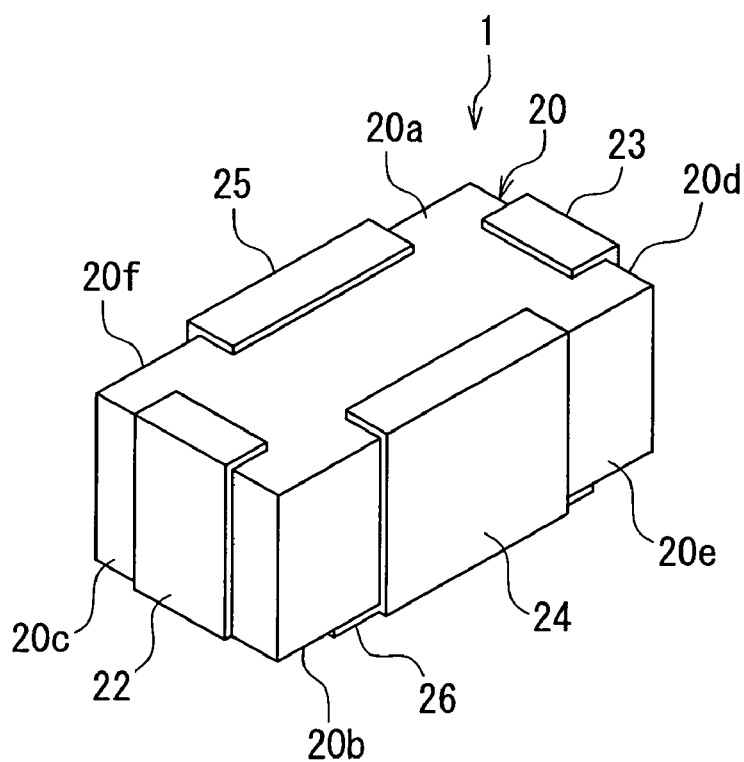
FIG. 2 is a perspective view illustrating the outer appearance of the layered low-pass filter according to the embodiment of the invention.

Reference is now made to FIG. 1 and FIG. 2 to describe an outline of the structure of the layered low-pass filter 1. FIG. 1 is a perspective view illustrating the main part of the layered low-pass filter 1. FIG. 2 is a perspective view illustrating the outer appearance of the layered low-pass filter 1.

The layered low-pass filter 1 includes a layered substrate 20 for integrating the components of the layered low-pass filter 1. The layered substrate 20 includes a plurality of dielectric layers and a plurality of conductor layers stacked, which will be described in more detail later. Each of the inductors 11 and 12 is provided within the layered substrate 20, being formed using at least one of the conductor layers located within the layered substrate 20. Each of the capacitors 13 to 17 is provided within the layered substrate 20, being formed using at least two of the conductor layers located within the layered substrate 20 and a dielectric layer located between those conductor layers.

As illustrated in FIG. 2, the layered substrate 20 is rectangular-solid-shaped, having a top surface 20a, a bottom surface 20b and side surfaces 20c, 20d, 20e and 20f, as the periphery. The layered low-pass filter 1 has: an input terminal 22 disposed on the side surface 20c: an output terminal 23 disposed on the side surface 20d opposite to the side surface 20c; a terminal 24 disposed on the side surface 20e: a grounding terminal 25 disposed on the side surface 20f opposite to the side surface 20e: and a bottom-surface terminal 26 disposed on the bottom surface 20b. The input terminal 22 corresponds to the input terminal 2 of FIG. 3, and the output terminal 23 corresponds to the output terminal 3 of FIG. 3. The terminal 24 is a terminal not connected to the circuit shown in FIG. 3. The grounding terminal 25 is connected to the ground. The bottom-surface terminal 26 is connected to the terminals 24 and 25.

Figure 4A:
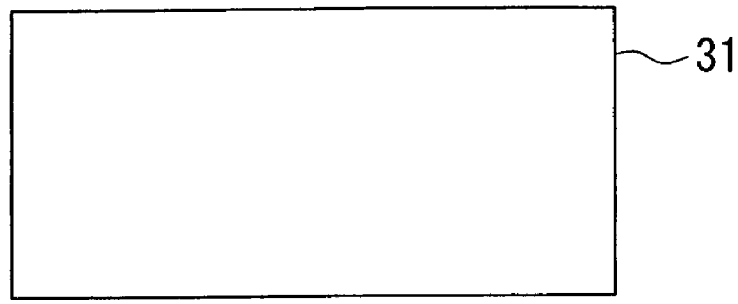
FIG. 4A to FIG. 4C illustrate the top surfaces of first to third dielectric layers of the layered substrate of the embodiment of the invention.
Figure 4B:
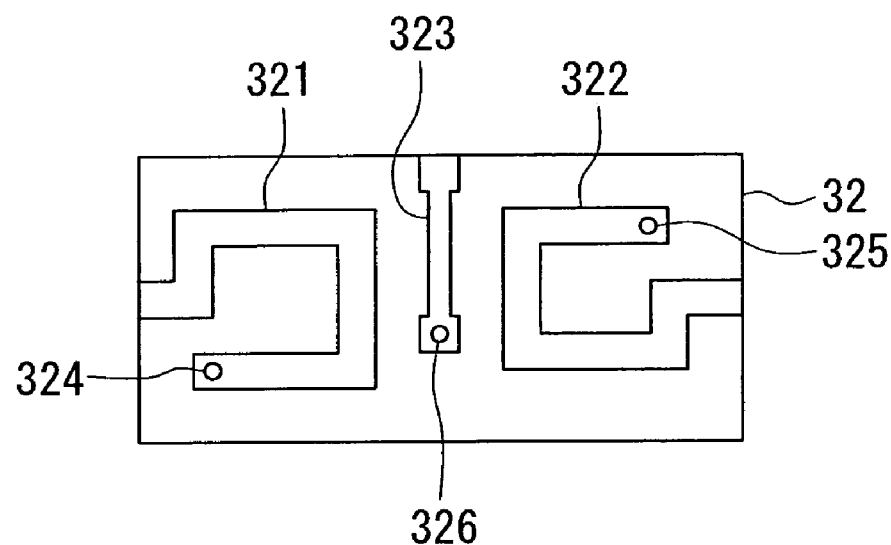
Figure 6A:
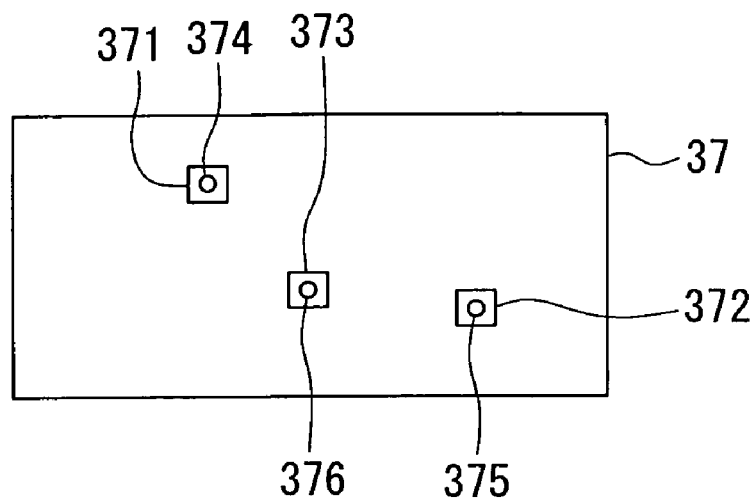
FIG. 6A to FIG. 6C illustrate the top surfaces of seventh to ninth dielectric layers of the layered substrate of the embodiment of the invention.
Figure 6B:
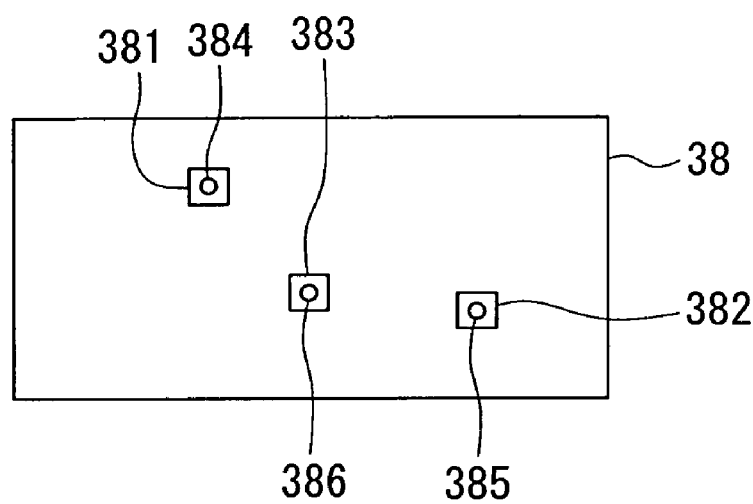
Figure 6C:
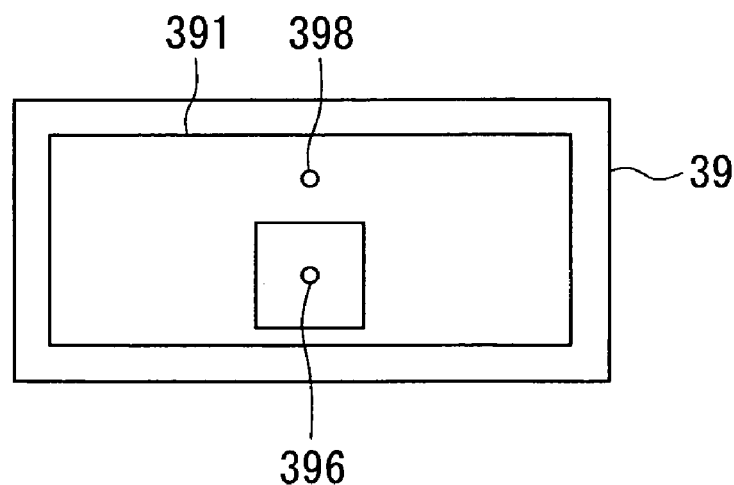
Figure 7A:
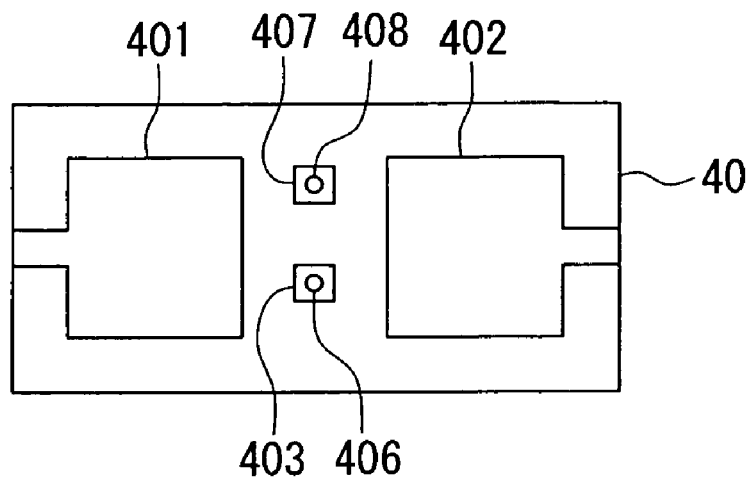
FIG. 7A to FIG. 7C illustrate the top surfaces of tenth to twelfth dielectric layers of the layered substrate of the embodiment of the invention.
Figure 7B:
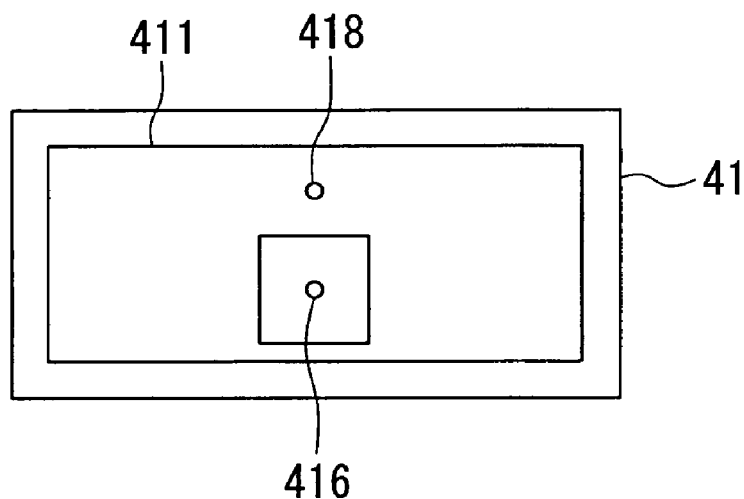
Figure 7C:
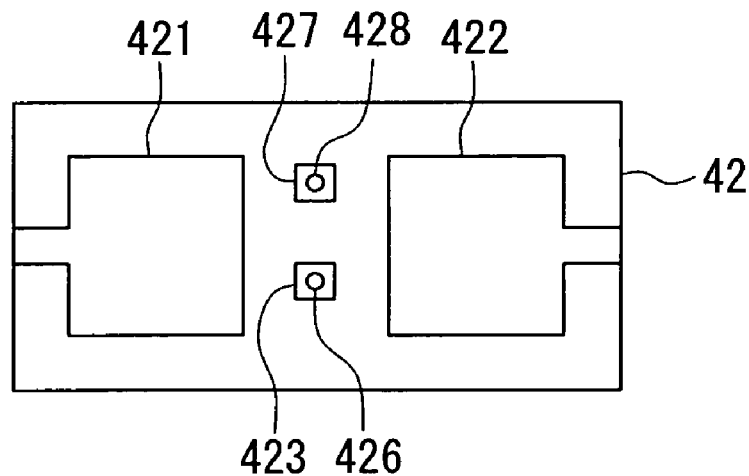
Figure 8A:
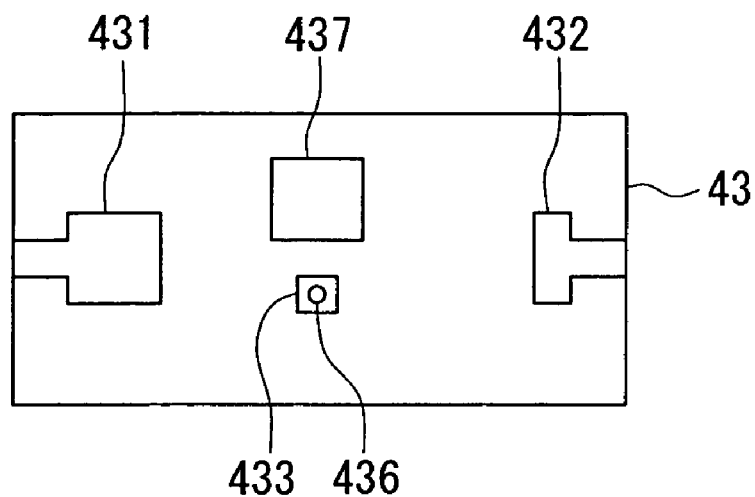
FIG. 8A and FIG. 8B illustrate the top surfaces of thirteenth and fourteenth dielectric layers of the layered substrate of the embodiment of the invention.
Figure 8B:
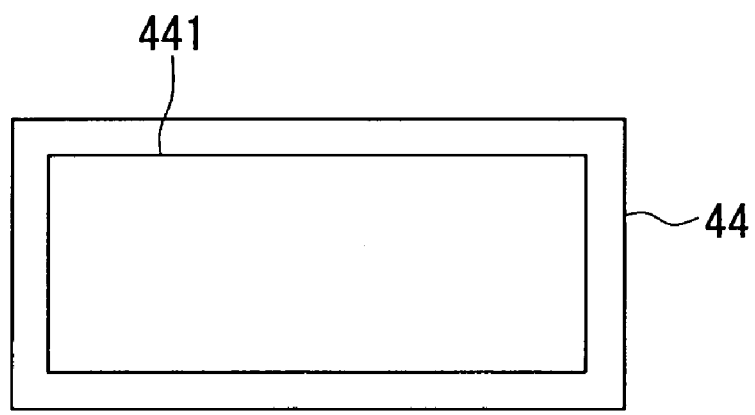

Reference is now made of FIG. 4A to FIG. 8B to describe the dielectric layers and the conductor layers of the layered substrate 20 in detail. FIG. 4A to FIG. 4C respectively illustrate the top surfaces of the first to third dielectric layers from the top. FIG. 5A to FIG. 5C respectively illustrate the top surfaces of the fourth to sixth dielectric layers from the top. FIG. 6A to FIG. 6C respectively illustrate the top surfaces of the seventh to ninth dielectric layers from the top. FIG. 7A to FIG. 7C respectively illustrate the top surfaces of the tenth to twelfth dielectric layers from the top. FIG. 8A and FIG. 8B respectively illustrate the top surfaces of the thirteenth and fourteenth dielectric layers from the top.

No conductor layer is formed on the top surface of the first dielectric layer 31 of FIG. 4A. Inductor-forming conductor layers 321 and 322 and a connecting conductor layer 323 are formed on the top surface of the second dielectric layer 32 of FIG. 4B. One end of the conductor layer 321 is connected to the input terminal 22. This end of the conductor layer 321 forms the input of the inductor 11. The conductor layer 321 extends in such a manner as to rotate in a clockwise direction from the one end toward the other end as seen from above. One end of the conductor layer 322 is connected to the output terminal 23. This end of the conductor layer 322 forms the output of the inductor 12. The conductor layer 322 extends in such a manner as to rotate in a clockwise direction from the one end toward the other end as seen from above. The conductor layer 323 is located between the conductor layers 321 and 322 as seen from above. One end of the conductor layer 323 is connected to the grounding terminal 25.

The dielectric layer 32 has a through hole 324 connected to a portion of the conductor layer 321 near the other end thereof, a through hole 325 connected to a portion of the conductor layer 322 near the other end thereof, and a through hole 326 connected to a portion of the conductor layer 323 near the other end thereof.

Figure 4C:
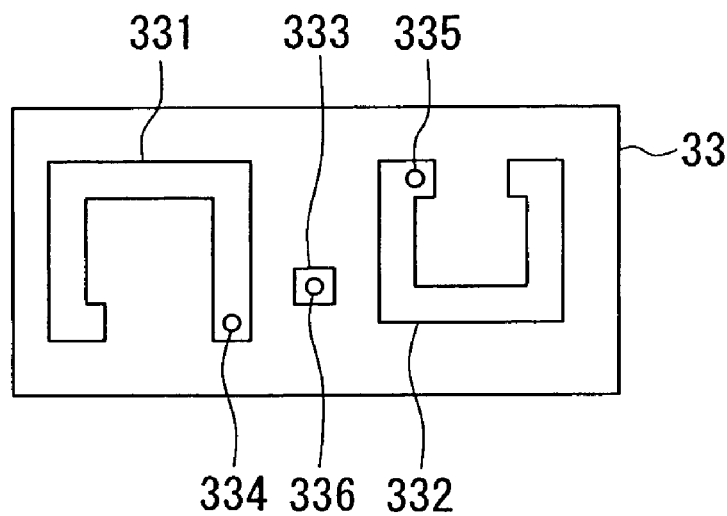

Inductor-forming conductor layers 331 and 332 and a conductor layer 333 are formed on the top surface of the third dielectric layer 33 of FIG. 4C. The through hole 324 is connected to a portion of the conductor layer 331 near one end thereof. The conductor layer 331 extends in such a manner as to rotate in a clockwise direction from the one end toward the other end as seen from above. The through hole 325 is connected to a portion of the conductor layer 332 near one end thereof. The conductor layer 332 extends in such a manner as to rotate in a clockwise direction from the one end toward the other end as seen from above.

The dielectric layer 33 has a through hole 334 connected to a portion of the conductor layer 331 near the other end thereof, a through hole 335 connected to a portion of the conductor layer 332 near the other end thereof, and a through hole 336 connected to the conductor layer 333. The through hole 336 is connected to the through hole 326.

Figure 5A:
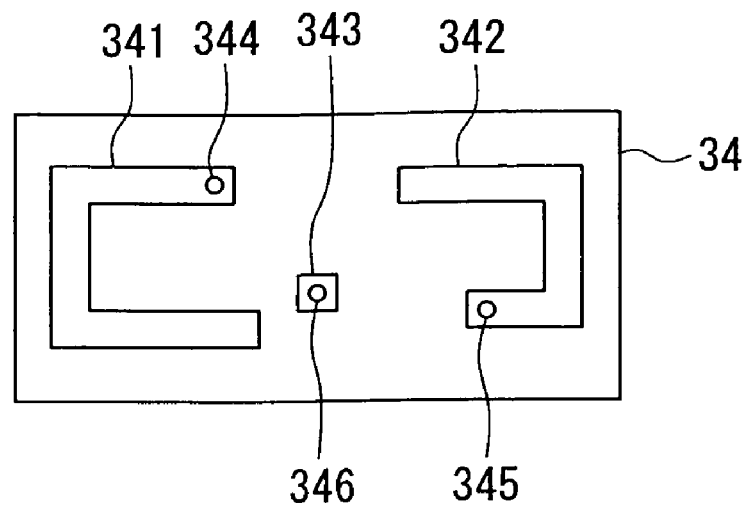
FIG. 5A to FIG. 5C illustrate the top surfaces of fourth to sixth dielectric layers of the layered substrate of the embodiment of the invention.

Inductor-forming conductor layers 341 and 342 and a conductor layer 343 are formed on the top surface of the fourth dielectric layer 34 of FIG. 5A. The through hole 334 is connected to a portion of the conductor layer 341 near one end thereof. The conductor layer 341 extends in such a manner as to rotate in a clockwise direction from the one end toward the other end as seen from above. The through hole 335 is connected to a portion of the conductor layer 342 near one end thereof. The conductor layer 342 extends in such a manner as to rotate in a clockwise direction from the one end toward the other end as seen from above.

The dielectric layer 34 has a through hole 344 connected to a portion of the conductor layer 341 near the other end thereof, a through hole 345 connected to a portion of the conductor layer 342 near the other end thereof, and a through hole 346 connected to the conductor layer 343. The through hole 346 is connected to the through hole 336. The portion of the conductor layer 341 connected to the through hole 344 forms the output of the inductor 11. The portion of the conductor layer 342 connected to the through hole 345 forms the input of the inductor 12.

The inductor 11 is formed using the conductor layers 321, 331 and 341 and the through holes 324 and 334. The inductor 11 extends in such a manner as to rotate in a clockwise direction from the input toward the output as seen from above. The inductor 12 is formed using the conductor layers 322, 332 and 342 and the through holes 325 and 335. The inductor 12 extends in such a manner as to rotate in a counterclockwise direction from the input toward the output as seen from above.

Figure 5B:
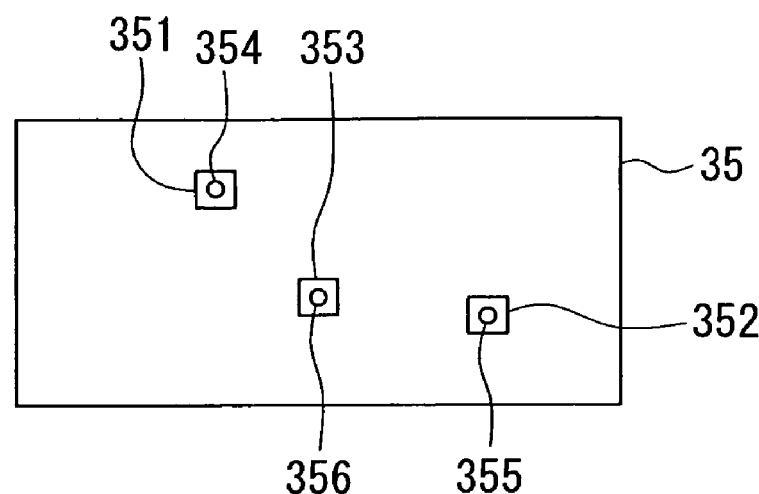

Conductor layers 351, 352 and 353 are formed on the top surface of the fifth dielectric layer 35 of FIG. 5B. The dielectric layer 35 has a through hole 354 connected to the conductor layer 351, a through hole 355 connected to the conductor layer 352, and a through hole 356 connected to the conductor layer 353. The through holes 354, 355 and 356 are connected to the through holes 344, 345 and 346, respectively.

Figure 5C:
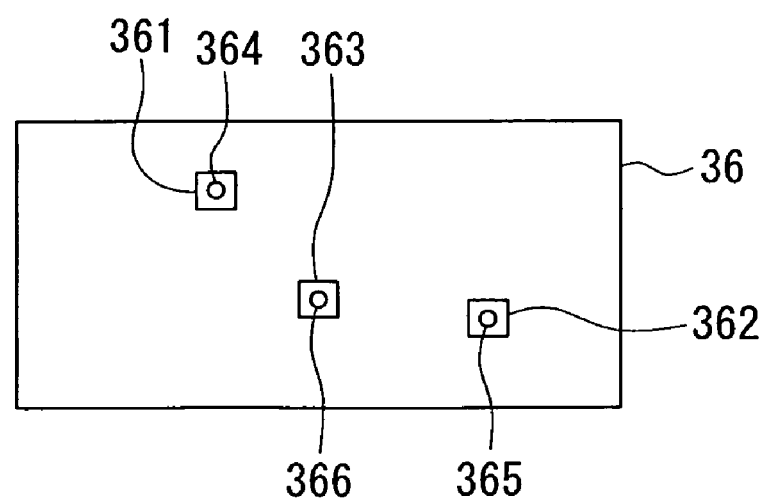

Conductor layers 361, 362 and 363 are formed on the top surface of the sixth dielectric layer 36 of FIG. 5C. The dielectric layer 36 has a through hole 364 connected to the conductor layer 361, a through hole 365 connected to the conductor layer 362, and a through hole 366 connected to the conductor layer 363. The through holes 364, 365 and 366 are connected to the through holes 354, 355 and 356, respectively.

Conductor layers 371, 372 and 373 are formed on the top surface of the seventh dielectric layer 37 of FIG. 6A. The dielectric layer 37 has a through hole 374 connected to the conductor layer 371, a through hole 375 connected to the conductor layer 372, and a through hole 376 connected to the conductor layer 373. The through holes 374, 375 and 376 are connected to the through holes 364, 365 and 366, respectively.

Conductor layers 381, 382 and 383 are formed on the top surface of the eighth dielectric layer 38 of FIG. 6B. The dielectric layer 38 has a through hole 384 connected to the conductor layer 381, a through hole 385 connected to the conductor layer 382, and a through hole 386 connected to the conductor layer 383. The through holes 384, 385 and 386 are connected to the through holes 374, 375 and 376, respectively.

A capacitor-forming conductor layer 391 is formed on the top surface of the ninth dielectric layer 39 of FIG. 6C. The through holes 384 and 385 are connected to the conductor layer 391. The dielectric layer 39 has a through hole 396 connected to the through hole 386, and a through hole 398 connected to the conductor layer 391.

Capacitor-forming conductor layers 401 and 402 and conductor layers 403 and 407 are formed on the top surface of the tenth dielectric layer 40 of FIG. 7A. The conductor layer 401 is connected to the input terminal 22. The conductor layer 402 is connected to the output terminal 23. The dielectric layer 40 has a through hole 406 connected to the conductor layer 403, and a through hole 408 connected to the conductor layer 407. The through holes 406 and 408 are connected to the through holes 396 and 398, respectively.

A capacitor-forming conductor layer 411 is formed on the top surface of the eleventh dielectric layer 41 of FIG. 7B. The dielectric layer 41 has a through hole 416 connected to the through hole 406, and a through hole 418 connected to the through hole 408 and to the conductor layer 411.

Capacitor-forming conductor layers 421 and 422 and conductor layers 423 and 427 are formed on the top surface of the twelfth dielectric layer 42 of FIG. 7C. The conductor layer 421 is connected to the input terminal 22. The conductor layer 422 is connected to the output terminal 23. The dielectric layer 42 has a through hole 426 connected to the conductor layer 423, and a through hole 428 connected to the conductor layer 427. The through holes 426 and 428 are connected to the through holes 416 and 418, respectively.

Capacitor-forming conductor layers 431, 432 and 437 and a conductor layer 433 are formed on the top surface of the thirteenth dielectric layer 43 of FIG. 8A. The conductor layer 431 is connected to the input terminal 22. The conductor layer 432 is connected to the output terminal 23. The through hole 428 is connected to the conductor layer 437. The dielectric layer 43 has a through hole 436 connected to the conductor layer 433. The through hole 436 is connected to the through hole 426.

A grounding conductor layer 441 is formed on the top surface of the fourteenth dielectric layer 44 of FIG. 8B. The through hole 436 is connected to the conductor layer 441.

The first to fourteenth dielectric layers 31 to 44 and the conductor layers described above are stacked to form the layered substrate 20 illustrated in FIG. 1 and FIG. 2. The terminals 22 to 26 of FIG. 2 are each formed on the periphery of the layered substrate 20.

In this embodiment, various types of substrates can be employed as the layered substrate 20, such as one in which the dielectric layers are made of resin, ceramic, or a resin-ceramic composite material. However, a low-temperature co-fired ceramic multilayer substrate, which is excellent in high frequency response, is particularly preferable as the layered substrate 20.

The internal structure of the layered substrate 20 will now be further described with reference to FIG. 1 also. As mentioned previously, the inductor 11 is formed using the conductor layers 321, 331 and 341 and the through holes 324 and 334. The inductor 12 is formed using the conductor layers 322, 332 and 342 and the through holes 325 and 335. The through holes 344, 354, 364, 374 and 384 constitute a conducting path 51 shown in FIG. 1. The conducting path 51 connects the output of the inductor 11 and the conductor layer 391 to each other. The through holes 345, 355, 365, 375 and 385 constitute a conducting path 52 shown in FIG. 1. The conducting path 52 connects the input of the inductor 12 and the conductor layer 391 to each other.

The conductor layer 401 is opposed to the conductor layer 391 with the dielectric layer 39 located in between, and is also opposed to the conductor layer 411 with the dielectric layer 40 located in between. The conductor layer 421 is opposed to the conductor layer 411 with the dielectric layer 41 located in between. The conductor layers 391, 401, 411 and 421 and the dielectric layers 39, 40 and 41 constitute the capacitor 16 of FIG. 3.

The conductor layer 402 is opposed to the conductor layer 391 with the dielectric layer 39 located in between, and is also opposed to the conductor layer 411 with the dielectric layer 40 located in between. The conductor layer 422 is opposed to the conductor layer 411 with the dielectric layer 41 located in between. The conductor layers 391, 402, 411 and 422 and the dielectric layers 39, 40 and 41 constitute the capacitor 17 of FIG. 3.

The through holes 398, 408, 418 and 428 constitute a conducting path 53 shown in FIG. 1. The conducting path 53 connects the conductor layers 391 and 437 to each other. The conductor layer 437 is opposed to the conductor layer 441 with the dielectric layer 43 located in between. The conductor layers 437 and 441 and the dielectric layer 43 constitute the capacitor 13 of FIG. 3. The capacitor 13 connects the grounding conductor layer 441 to the output of the inductor 11 and to the input of the inductor 12.

The conductor layers 431 and 432 are opposed to the conductor layer 441 with the dielectric layer 43 located between the conductor layer 441 and each of the conductor layers 431 and 432. The conductor layers 431 and 441 and the dielectric layer 43 constitute the capacitor 14 of FIG. 3. The conductor layer 431 is connected to the one end of the inductor-forming conductor layer 321 via the input terminal 22. Consequently, the capacitor 14 connects the grounding conductor layer 441 to the input of the inductor 11.

The conductor layers 432 and 441 and the dielectric layer 43 constitute the capacitor 15 of FIG. 3. The conductor layer 432 is connected to the one end of the inductor-forming conductor layer 322 via the output terminal 23. Consequently, the capacitor 15 connects the grounding conductor layer 441 to the output of the inductor 12.

The grounding conductor layer 441 is located closer to the bottom surface 20b of the layered substrate 20 than to the top surface 20a. The connecting conductor layer 323 connected to the grounding terminal 25 is located between the grounding conductor layer 441 and the top surface 20a of the layered substrate 20. The conducting portion 6 is provided within the layered substrate 20 and connects the grounding conductor layer 441 to the grounding terminal 25. The conducting portion 6 is formed of the conductor layer 323 and a conducting path 54. The conducting path 54 is formed using at least one through hole provided within the layered substrate 20, and extends in the direction in which the layers of the layered substrate 20 are stacked. In the present embodiment, the conducting path 54 is formed of the through holes 326, 336, 346, 356, 366, 376, 386, 396, 406, 416, 426 and 436 connected in series. The conducting path 54 connects the connecting conductor layer 323 and the grounding conductor layer 441 to each other.

Figure 9:
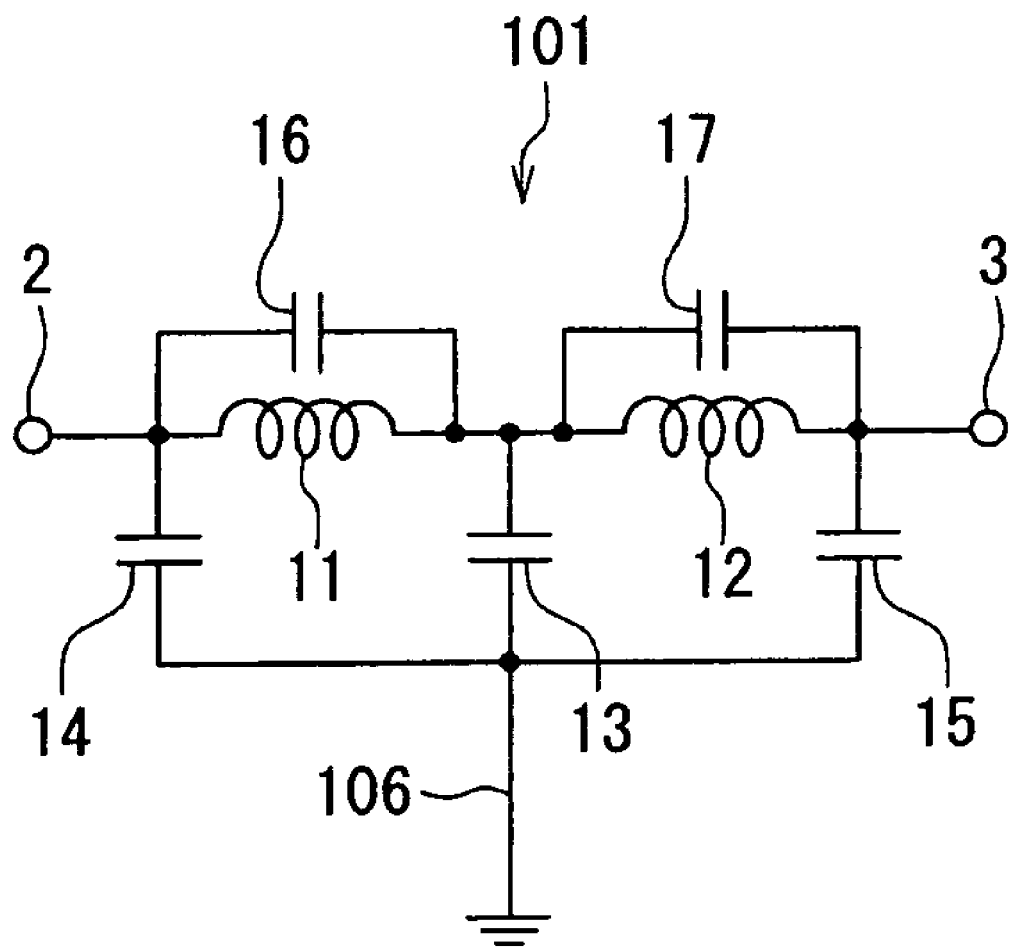
FIG. 9 is a circuit diagram illustrating the circuit configuration of a layered low-pass filter of a comparative example.

The functions and effects of the layered low-pass filter 1 according to the present embodiment will now be described in comparison with a layered low-pass filter 101 of a comparative example. First, a description will be given of the circuit configuration of the layered low-pass filter 101 of the comparative example with reference to FIG. 9. As illustrated in FIG. 9, the layered low-pass filter 101 of the comparative example has a conducting portion 106 instead of the conducting portion 6 of the layered low-pass filter 1 according to the present embodiment. The conducting portion 106 connects the second end of each of the capacitors 13, 14 and 15 to the grounding terminal in the shortest distance.

The layered low-pass filter 101 of the comparative example further has a layered substrate 20 for integrating the components of the layered low-pass filter 101. The outer appearance of the layered low-pass filter 101 of the comparative example is as shown in FIG. 2, like the layered low-pass filter 1 according to the present embodiment. In the layered low-pass filter 101 of the comparative example, however, the terminal 24 as well as the terminal 25 is a grounding terminal connected to the ground.

Figure 10A:
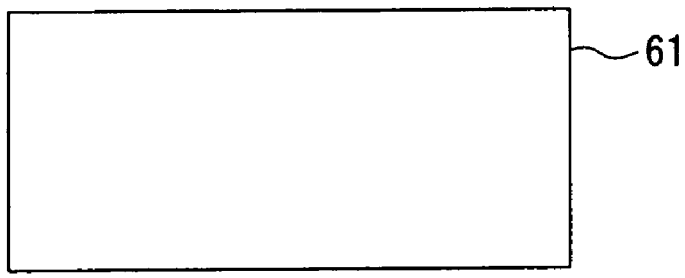
FIG. 10A to FIG. 10C illustrate the top surfaces of first to third dielectric layers of the layered substrate of the comparative example.
Figure 10B:
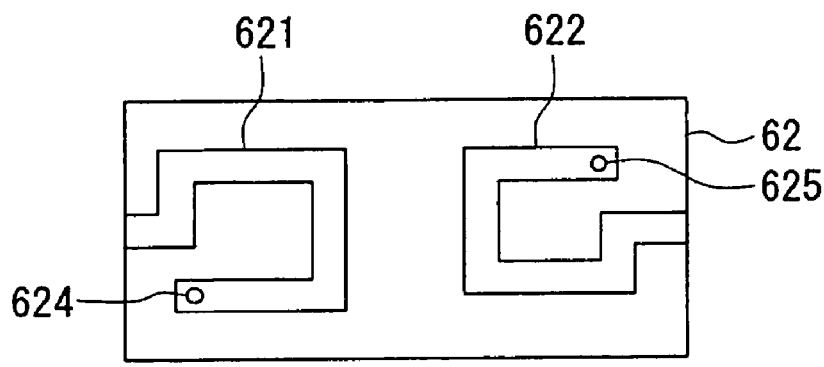
Figure 12A:
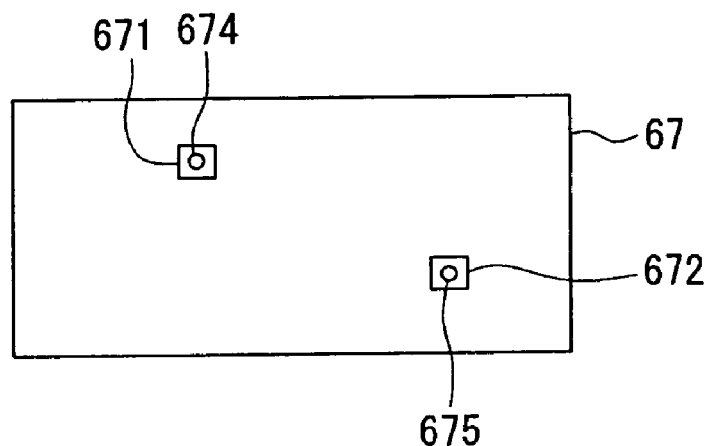
FIG. 12A to FIG. 12C illustrate the top surfaces of seventh to ninth dielectric layers of the layered substrate of the comparative example.
Figure 12B:
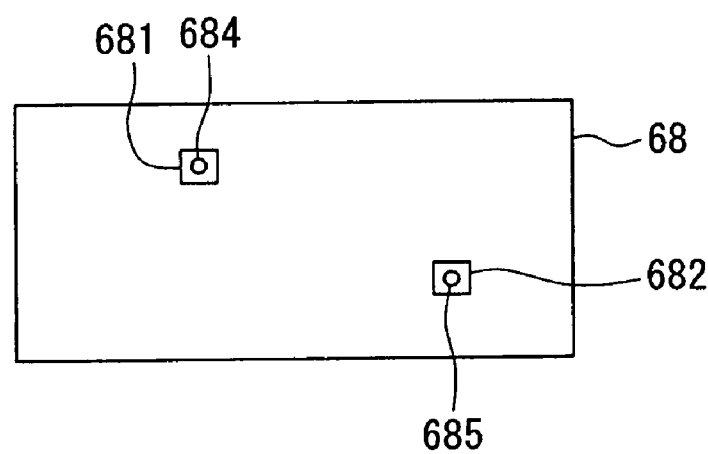
Figure 12C:
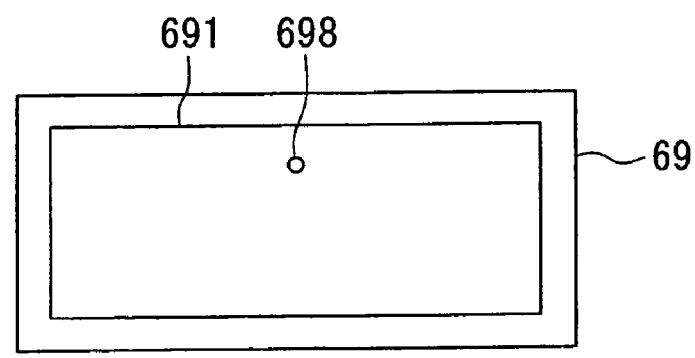
Figure 13A:
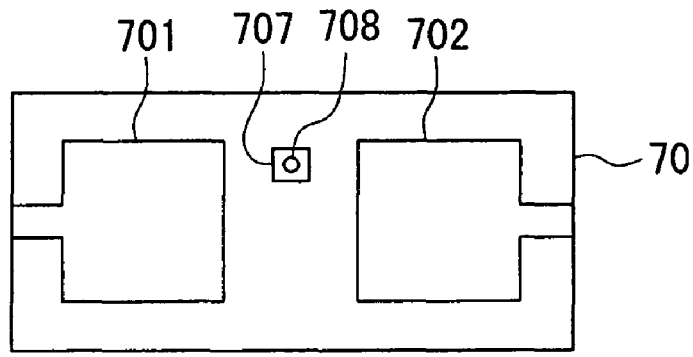
FIG. 13A to FIG. 13C illustrate the top surfaces of tenth to twelfth dielectric layers of the layered substrate of the comparative example.
Figure 13B:
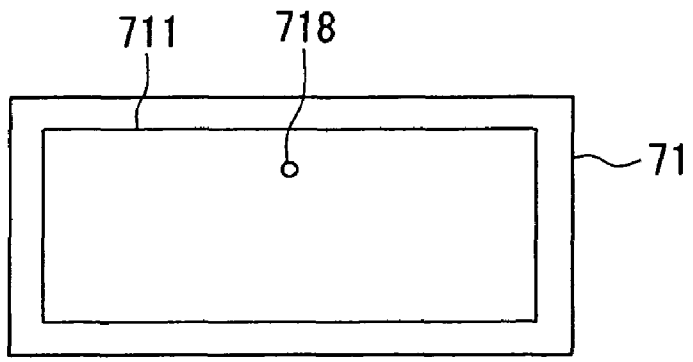
Figure 13C:
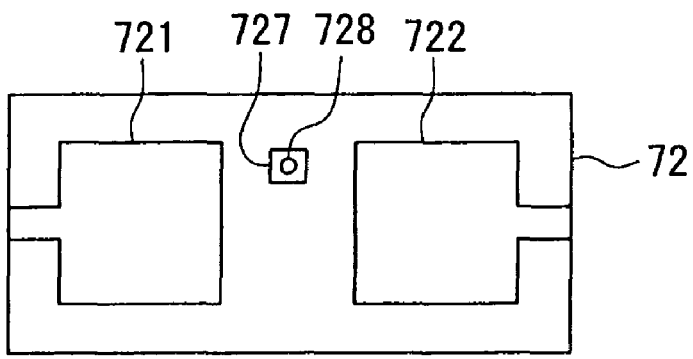
Figure 14A:
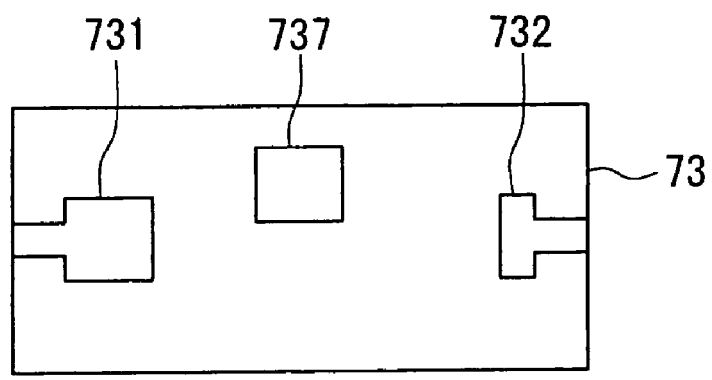
FIG. 14A and FIG. 14B illustrate the top surfaces of thirteenth and fourteenth dielectric layers of the layered substrate of the comparative example.
Figure 14B:
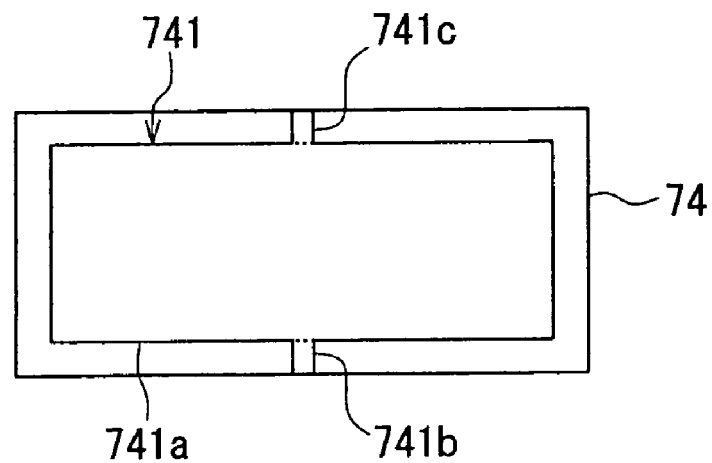

Reference is now made to FIG. 10A to FIG. 14B to describe the dielectric layers and the conductor layers of the layered substrate 20 of the layered low-pass filter 101 of the comparative example. FIG. 10A to FIG. 10C respectively illustrate the top surfaces of the first to third dielectric layers from the top. FIG. 11A to FIG. 11C respectively illustrate the top surfaces of the fourth to sixth dielectric layers from the top. FIG. 12A to FIG. 12C respectively illustrate the top surfaces of the seventh to ninth dielectric layers from the top. FIG. 13A to FIG. 13C respectively illustrate the top surfaces of the tenth to twelfth dielectric layers from the top. FIG. 14A and FIG. 14B respectively illustrate the top surfaces of the thirteenth and fourteenth dielectric layers from the top.

No conductor layer is formed on the top surface of the first dielectric layer 61 of FIG. 10A. Inductor-forming conductor layers 621 and 622 similar to the inductor-forming conductor layers 321 and 322 of the present embodiment are formed on the top surface of the second dielectric layer 62 of FIG. 10B. The dielectric layer 62 has through holes 624 and 625 similar to the through holes 324 and 325 of the present embodiment.

Figure 10C:
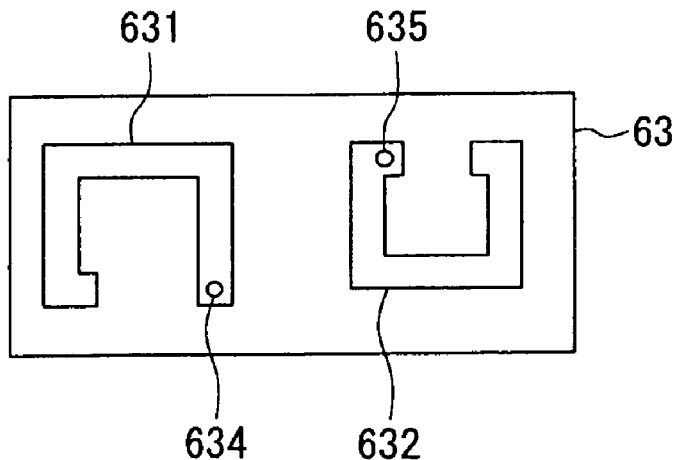

Inductor-forming conductor layers 631 and 632 similar to the inductor-forming conductor layers 331 and 332 of the present embodiment are formed on the top surface of the third dielectric layer 63 of FIG. 10C. The dielectric layer 63 has through holes 634 and 635 similar to the through holes 334 and 335 of the present embodiment.

Figure 11A:
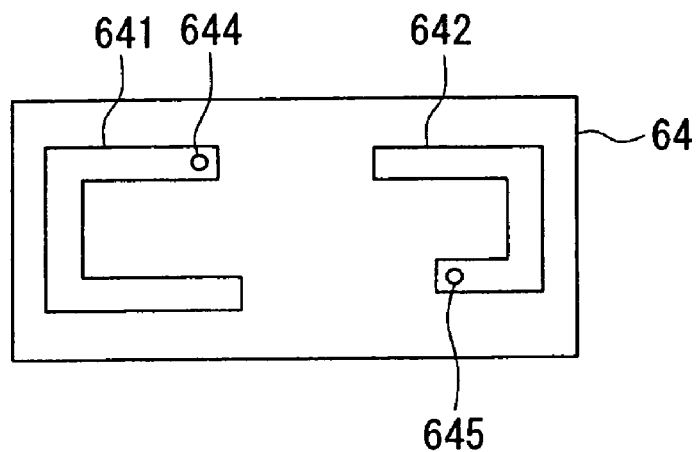
FIG. 11A to FIG. 11C illustrate the top surfaces of fourth to sixth dielectric layers of the layered substrate of the comparative example.

Inductor-forming conductor layers 641 and 642 similar to the inductor-forming conductor layers 341 and 342 of the present embodiment are formed on the top surface of the fourth dielectric layer 64 of FIG. 11A. The dielectric layer 64 has through holes 644 and 645 similar to the through holes 344 and 345 of the present embodiment.

Figure 11B:
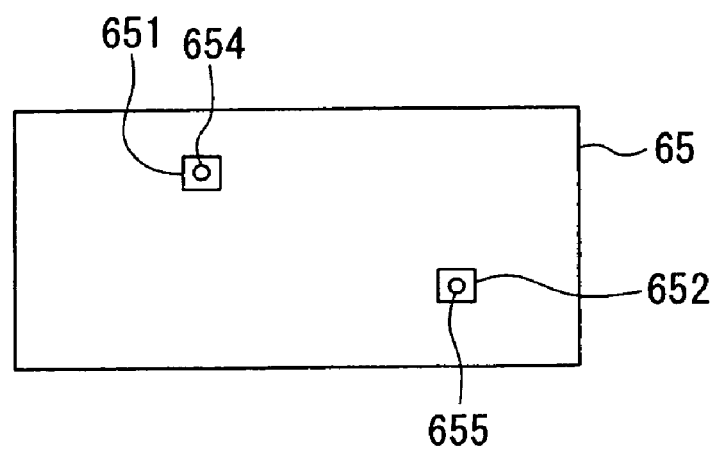

Conductor layers 651 and 652 similar to the conductor layers 351 and 352 of the present embodiment are formed on the top surface of the fifth dielectric layer 65 of FIG. 11B. The dielectric layer 65 has through holes 654 and 655 similar to the through holes 354 and 355 of the present embodiment.

Figure 11C:
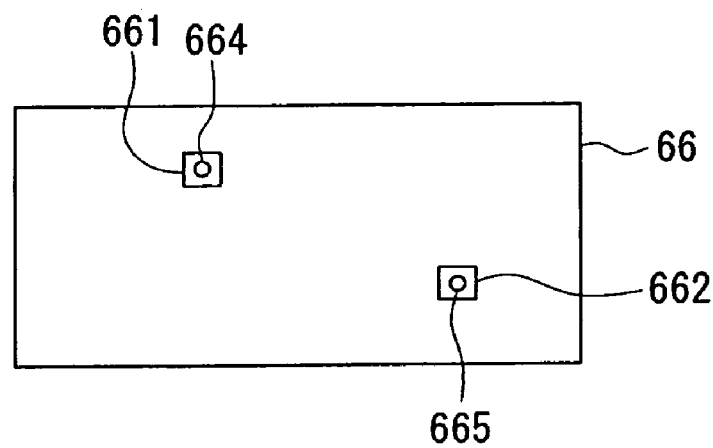

Conductor layers 661 and 662 similar to the conductor layers 361 and 362 of the present embodiment are formed on the top surface of the sixth dielectric layer 66 of FIG. 11C. The dielectric layer 66 has through holes 664 and 665 similar to the through holes 364 and 365 of the present embodiment.

Conductor layers 671 and 672 similar to the conductor layers 371 and 372 of the present embodiment are formed on the top surface of the seventh dielectric layer 67 of FIG. 12A. The dielectric layer 67 has through holes 674 and 675 similar to the through holes 374 and 375 of the present embodiment.

Conductor layers 681 and 682 similar to the conductor layers 381 and 382 of the present embodiment are formed on the top surface of the eighth dielectric layer 68 of FIG. 12B. The dielectric layer 68 has through holes 684 and 685 similar to the through holes 384 and 385 of the present embodiment.

A capacitor-forming conductor layer 691 is formed on the top surface of the ninth dielectric layer 69 of FIG. 12C. The through holes 684 and 685 are connected to the conductor layer 691. The dielectric layer 69 has a through hole 698 connected to the conductor layer 691.

Capacitor-forming conductor layers 701 and 702 and a conductor layer 707 similar to the capacitor-forming conductor layers 401 and 402 and the conductor layer 407 of the present embodiment are formed on the top surface of the tenth dielectric layer 70 of FIG. 13A. The dielectric layer 70 has a through hole 708 connected to the through hole 698 and to the conductor layer 707.

A capacitor-forming conductor layer 711 is formed on the top surface of the eleventh dielectric layer 71 of FIG. 13B. The dielectric layer 71 has a through hole 718 connected to the through hole 708 and to the conductor layer 711.

Capacitor-forming conductor layers 721 and 722 and a conductor layer 727 similar to the capacitor-forming conductor layers 421 and 422 and the conductor layer 427 of the present embodiment are formed on the top surface of the twelfth dielectric layer 72 of FIG. 13C. The dielectric layer 72 has a through hole 728 connected to the through hole 718 and to the conductor layer 727.

Capacitor-forming conductor layers 731 and 732 and a conductor layer 737 similar to the capacitor-forming conductor layers 431 and 432 and the conductor layer 437 of the present embodiment are formed on the top surface of the thirteenth dielectric layer 73 of FIG. 14A. The through hole 728 is connected to the conductor layer 737.

A grounding conductor layer 741 is formed on the top surface of the fourteenth dielectric layer 74 of FIG. 14B. The conductor layer 741 includes: a capacitor-forming portion 741a whose planar shape is rectangular; and projections 741b and 741c projecting outward from the capacitor-forming portion 741a. The capacitor-forming portion 741a corresponds to the grounding conductor layer 441 of the present embodiment. The projection 741b connects the capacitor-forming portion 741a to the grounding terminal 24 in the shortest distance. The projection 741c connects the capacitor-forming portion 741a to the grounding terminal 25 in the shortest distance.

The first to fourteenth dielectric layers 61 to 74 and the conductor layers described above are stacked to form the layered substrate 20 of the comparative example. The terminals 22 to 26 shown in FIG. 2 are each formed on the periphery of the layered substrate 20.

In the layered low-pass filter 101 of the comparative example, the inductor 11 is formed using the conductor layers 621, 631 and 641 and the through holes 624 and 634. The inductor 12 is formed using the conductor layers 622, 632 and 642 and the through holes 625 and 635. The through holes 644, 654, 664, 674 and 684 constitute a conducting path 51, as in the present embodiment. The conducting path 51 connects the output of the inductor 11 and the conductor layer 691 to each other. The through holes 645, 655, 665, 675 and 685 constitute a conducting path 52, as in the present embodiment. The conducting path 52 connects the input of the inductor 12 and the conductor layer 691 to each other.

The conductor layer 701 is opposed to the conductor layer 691 with the dielectric layer 69 located in between, and is also opposed to the conductor layer 711 with the dielectric layer 70 located in between. The conductor layer 721 is opposed to the conductor layer 711 with the dielectric layer 71 located in between. The conductor layers 691, 701, 711 and 721 and the dielectric layers 69, 70 and 71 constitute the capacitor 16 of FIG. 9.

The conductor layer 702 is opposed to the conductor layer 691 with the dielectric layer 69 located in between, and is also opposed to the conductor layer 711 with the dielectric layer 70 located in between. The conductor layer 722 is opposed to the conductor layer 711 with the dielectric layer 71 located in between. The conductor layers 691, 702, 711 and 722 and the dielectric layers 69, 70 and 71 constitute the capacitor 17 of FIG. 9.

The through holes 698, 708, 718 and 728 constitute a conducting path 53, as in the present embodiment. The conducting path 53 connects the conductor layers 691 and 737 to each other. The conductor layer 737 is opposed to the conductor layer 741 with the dielectric layer 73 located in between. The conductor layers 737 and 741 and the dielectric layer 73 constitute the capacitor 13 of FIG. 9.

The conductor layers 731 and 732 are opposed to the conductor layer 741 with the dielectric layer 73 located between the conductor layer 741 and each of the conductor layers 731 and 732. The conductor layers 731 and 741 and the dielectric layer 73 constitute the capacitor 14 of FIG. 9. The conductor layers 732 and 741 and the dielectric layer 73 constitute the capacitor 15 of FIG. 9.

The layered low-pass filter 101 of the comparative example is without the conducting path 54 of the present embodiment. In the layered low-pass filter 101 of the comparative example, the projections 741b and 741c constitute the conducting portion 106 of FIG. 9. In the layered low-pass filter 101 of the comparative example, the second end of each of the capacitors 13, 14 and 15 is formed by the capacitor-forming portion 741a of the conductor layer 741. The conducting portion 106 formed of the projections 741b and 741c therefore connects the second ends of the capacitors 13, 14 and 15 to the grounding terminals 24 and 25 in the shortest distance. The inductance component of the conducting portion 106 is much smaller than that of the conducting portion 6, which is formed of the conductor layer 323 and the conducting path 54, of the present embodiment.

In the present embodiment, the grounding terminal 25 is present on a side of the grounding conductor layer 441 in a direction parallel to the top surface of the dielectric layer 44. Therefore, the shortest distance between the grounding conductor layer 441 and the grounding terminal 25 is equal to the spacing between the grounding conductor layer 441 and the grounding terminal 25 taken in the direction parallel to the top surface of the dielectric layer 44. When the grounding conductor layer 441 and the grounding terminal 25 are disposed in such a manner, the grounding conductor layer 441 and the grounding terminal 25 would be typically connected via the shortest path like the projection 741c of the comparative example shown in FIG. 14B.

In the present embodiment, however, the conducting portion 6 formed of the conductor layer 323 and the conducting path 54 connects the grounding conductor layer 441 to the grounding terminal 25 via a path longer than the shortest distance between the grounding conductor layer 441 and the grounding terminal 25. The inductance component of the conducting portion 6 is much greater than that of the conducting portion 106 of the comparative example.

Figure 15:
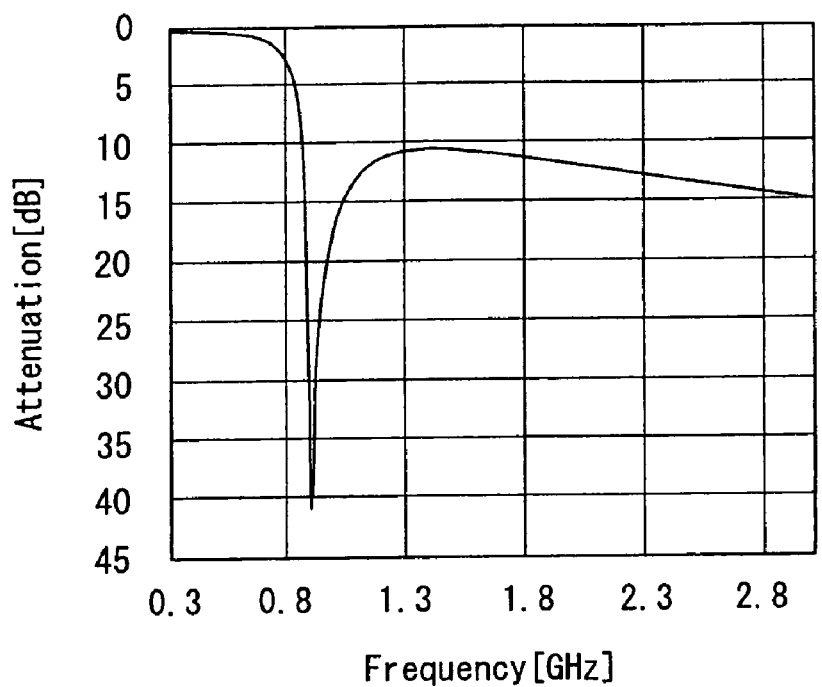
FIG. 15 is a plot illustrating the pass attenuation characteristic of the layered low-pass filter of the comparative example.
Figure 16:
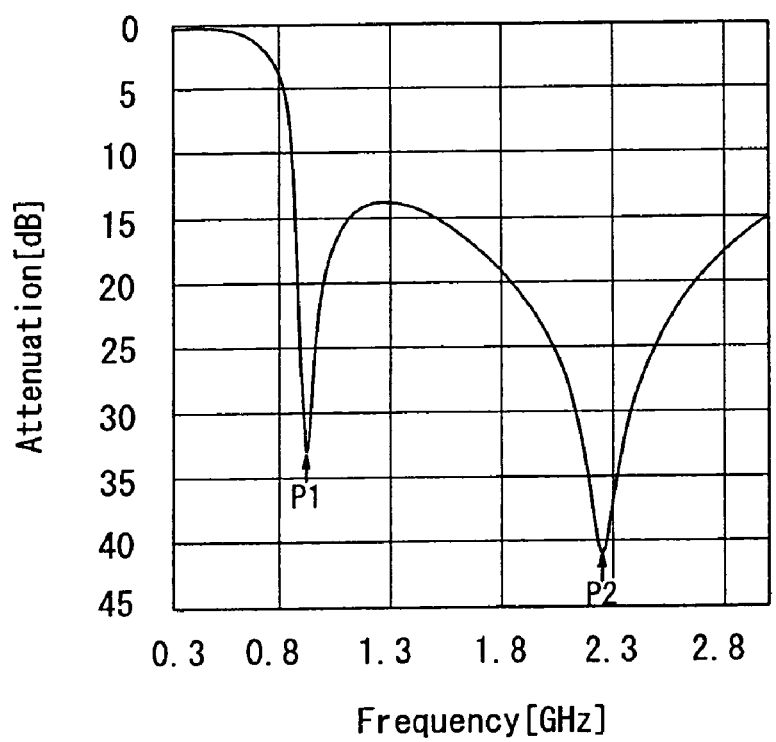
FIG. 16 is a plot illustrating the pass attenuation characteristic of the layered low-pass filter according to the embodiment of the invention.

A description will now be made on the results of comparison between the pass attenuation characteristic of the layered low-pass filter 1 according to the present embodiment and that of the layered low-pass filter 101 of the comparative example by simulation. FIG. 15 shows the pass attenuation characteristic of the layered low-pass filter 101 of the comparative example. FIG. 16 shows the pass attenuation characteristic of the layered low-pass filter 1 according to the present embodiment. In FIG. 15 and FIG. 16 the horizontal axis represents frequency, while the vertical axis represents attenuation. The pass attenuation characteristics shown in FIG. 15 and FIG. 16 were obtained by simulation.

In the pass attenuation characteristic of the layered low-pass filter 101 of the comparative example, first and second attenuation poles appear in the stop band. The frequency at which the second attenuation pole appears is higher than the frequency at which the first attenuation pole appears. FIG. 15 shows only the first attenuation pole because the frequency at which the second attenuation pole appears is higher than the frequency band shown in FIG. 15. The second attenuation pole occurs due to the formation of a trap circuit by the capacitors 13, 14 and 15 of FIG. 9 and the inductance component of the conducting portion 106.

As shown in FIG. 16, in the pass attenuation characteristic of the layered low-pass filter 1 according to the present embodiment, a first attenuation pole P1 and a second attenuation pole P2 appear in the stop band. The frequency at which the second attenuation pole P2 appears is higher than the frequency at which the first attenuation pole P1 appears. The second attenuation pole P2 occurs due to the formation of a trap circuit by the capacitors 13, 14 and 15 of FIG. 3 and the inductance component of the conducting portion 6. As previously described, the inductance component of the conducting portion 6 of the present embodiment is greater than that of the conducting portion 106 of the comparative example. Consequently, according to the present embodiment, the second attenuation pole P2 appears at a lower frequency compared with the second attenuation pole of the comparative example. Furthermore, according to the present embodiment, it is possible to adjust the frequency at which the second attenuation pole P2 appears by adjusting the magnitude of the inductance component of the conducting portion 6. The magnitude of the inductance component of the conducting portion 6 is easily adjustable by, e.g., changing the length or diameter of the conducting path 54 formed of a plurality of through holes.

In the case where it is required to increase attenuation especially in a specific narrow frequency band present in the stop band of a low-pass filter that exhibits at least a first attenuation pole in its pass attenuation characteristic in a signal path in which the low-pass filter is used, the specific narrow frequency band is typically present within a range from the frequency at which the first attenuation pole appears to a frequency on the order of several times higher than the cut-off frequency. According to the comparative example, the frequency at which the second attenuation pole appears is extremely higher than the cut-off frequency. Consequently, according to the comparative example, it is difficult to increase attenuation especially in a specific narrow frequency band present in the stop band of the layered low-pass filter 101 by utilizing the second attenuation pole.

In contrast, according to the present embodiment, the frequency at which the second attenuation pole appears is lower than in the case where the second end of each of the capacitors 13, 14 and 15 is connected to the grounding terminal via the shortest path as in the comparative example. Consequently, according to the present embodiment, it is possible to generate the second attenuation pole within the range from the frequency at which the first attenuation pole appears to a frequency on the order of several times higher than the cut-off frequency. The present embodiment thus allows increasing attenuation especially in a specific narrow frequency band present in the stop band of the layered low-pass filter 1 by utilizing the second attenuation pole, without providing any notch filter in series to the layered low-pass filter 1.

Furthermore, in the low-pass filter 1 according to the present embodiment, the conducting path 54, which is part of the conducting portion 6, extends in the stacking direction of the layers of the layered substrate 20 in such a manner as to pass through the space between the inductor 11 and the inductor 12. The conductor layer 323, which is part of the conducting portion 6, is disposed between the inductor-forming conductor layers 321 and 322 on the top surface of the dielectric layer 32 on which the conductor layers 321 and 322 are disposed. In this way, according to the present embodiment, the conducting portion 6 is formed by effectively using the space within the layered substrate 20. The present embodiment thus makes it possible to increase attenuation especially in a specific narrow frequency band present in the stop band of the layered low-pass filter 1 by utilizing the second attenuation pole, while satisfying the demands for reductions in size and thickness of the layered low-pass filter 1.

The present invention is not limited to the foregoing embodiment but can be carried out in various modifications. For example, the layered low-pass filter of the present invention may include three or more inductors connected in series. In this case, it suffices that at least two of the three of more inductors correspond to the first and second inductors of the present invention. In the present invention, each of the inductors may be formed using a single conductor layer, or two conductor layers or four or more conductor layers connected via at least one through hole. In the present invention, it suffices that the conducting path 54 is formed using at least one through hole, and the number of the through hole(s) constituting the conducting path 54 can be freely chosen.

The layered low-pass filter of the present invention is useful as a low-pass filter for use in reception devices for one-segment broadcasts, for example.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A layered low-pass filter comprising:
   a layered substrate including a plurality of dielectric layers stacked;
   an input terminal, an output terminal and a grounding terminal each disposed on a periphery of the layered substrate;
   a first inductor and a second inductor each formed using at least one conductor layer provided within the layered substrate, the first and second inductors being connected in series to each other and, in terms of circuit configuration, located between the input terminal and the output terminal;
   first to fifth capacitors provided within the layered substrate;
   a grounding conductor layer provided within the layered substrate; and
   a conducting portion provided within the layered substrate and connecting the grounding conductor layer to the grounding terminal, wherein,
   in terms of circuit configuration, the first inductor is located closer to the input terminal than is the second inductor;
   each of the first and second inductors has an input for receiving signals and an output for outputting signals;
   the output of the first inductor is connected to the input of the second inductor;
   the first capacitor is connected in parallel to the first inductor;
   the second capacitor is connected in parallel to the second inductor;
   the third capacitor connects the grounding conductor layer to the output of the first inductor and to the input of the second inductor;
   the fourth capacitor connects the grounding conductor layer to the input of the first inductor;
   the fifth capacitor connects the grounding conductor layer to the output of the second inductor; and
   the conducting portion connects the grounding conductor layer to the grounding terminal via a connecting pathway that is longer than a shortest distance between the grounding conductor layer and the grounding terminal.

2. The layered low-pass filter according to claim 1, wherein:
   the layered substrate has a top surface, a bottom surface and a side surface, as the periphery;
   the grounding conductor layer is disposed closer to the bottom surface than to the top surface;
   the grounding terminal is disposed on the side surface;
   the conducting portion includes: a connecting conductor layer provided within the layered substrate and connected to the grounding terminal; and a conducting path that connects the connecting conductor layer and the grounding conductor layer to each other;
   the connecting conductor layer is disposed between the grounding conductor layer and the top surface of the layered substrate; and
   the conducting path is formed using at least one through hole provided within the layered substrate, and extends in a direction in which the layers of the layered substrate are stacked.

3. The layered low-pass filter according to claim 2, wherein the conducting path passes through a space between the first and second inductors within the layered substrate.

* * * * *